United States Patent
Huemoeller et al.

(10) Patent No.: US 7,145,238 B1
(45) Date of Patent: Dec. 5, 2006

(54) SEMICONDUCTOR PACKAGE AND SUBSTRATE HAVING MULTI-LEVEL VIAS

(75) Inventors: Ronald Patrick Huemoeller, Chandler, AZ (US); David Jon Hiner, Chandler, AZ (US); Sukianto Rusli, Phoenix, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 31 days.

(21) Appl. No.: 10/839,647

(22) Filed: May 5, 2004

(51) Int. Cl.
*H01L 23/48* (2006.01)

(52) U.S. Cl. ..................................... 257/750; 257/752

(58) Field of Classification Search .............. 257/752, 257/754, 750
See application file for complete search history.

(56) References Cited

U.S. PATENT DOCUMENTS

| | | | |
|---|---|---|---|
| 3,868,724 A | 2/1975 | Perrino | 357/65 |
| 3,916,434 A | 10/1975 | Garboushian | 357/74 |
| 4,322,778 A | 3/1982 | Barbour et al. | |
| 4,532,419 A | 7/1985 | Takeda | 235/492 |
| 4,642,160 A | 2/1987 | Burgess | |
| 4,685,033 A | 8/1987 | Inoue | |
| 4,706,167 A | 11/1987 | Sullivan | 361/406 |
| 4,716,049 A | 12/1987 | Patraw | 427/96 |
| 4,786,952 A | 11/1988 | MacIver et al. | 357/23.4 |
| 4,811,082 A | 3/1989 | Jacobs et al. | |
| 4,897,338 A | 1/1990 | Spicciati et al. | 430/314 |
| 4,905,124 A | 2/1990 | Banjo et al. | 361/395 |
| 4,964,212 A | 10/1990 | Deroux-Dauphin et al. | 29/852 |
| 4,974,120 A | 11/1990 | Kodai et al. | 361/392 |
| 4,996,391 A | 2/1991 | Schmidt | 174/255 |
| 5,021,047 A | 6/1991 | Movern | |
| 5,072,075 A | 12/1991 | Lee et al. | |
| 5,081,520 A | 1/1992 | Yoshii et al. | 357/80 |
| 5,108,553 A | 4/1992 | Foster et al. | 205/125 |
| 5,110,664 A | 5/1992 | Nakanishi et al. | 428/195 |
| 5,191,174 A | 3/1993 | Chang et al. | |
| 5,229,550 A | 7/1993 | Birdra et al. | |
| 5,239,448 A | 8/1993 | Perkins et al. | |
| 5,247,429 A | 9/1993 | Iwase et al. | 362/29 |
| 5,283,459 A | 2/1994 | Hirano et al. | 257/419 |
| 5,371,654 A | 12/1994 | Beaman et al. | 361/744 |
| 5,379,191 A | 1/1995 | Carey et al. | 361/777 |
| 5,404,044 A | 4/1995 | Booth et al. | |
| 5,463,253 A | 10/1995 | Waki et al. | 257/724 |

(Continued)

FOREIGN PATENT DOCUMENTS

JP     05-109975     4/1993

(Continued)

*Primary Examiner*—Roy Potter
(74) *Attorney, Agent, or Firm*—Gunnison, McKay & Hodgson, L.L.P.; Serge J. Hodgson (57) ABSTRACT

A semiconductor package and substrate having multi-level plated vias provide a high density blind via solution at low incremental cost. Via are half-plated atop a circuit pattern and then a second via half is added to complete the via after isolation of elements of the circuit pattern. Successive resist pattern applications and etching are used to form a via tier atop a circuit pattern that is connected by a thin plane of metal. After the tier is deposited, the thin metal plane is etched to isolate the circuit pattern elements. Dielectric is then deposited and the top half of the via is deposited over the tier. The tier may have a larger or smaller diameter with respect to the other half of the via, so that the via halves may be properly registered. Tin plating may also be used to control the etching process to provide etching control.

20 Claims, 8 Drawing Sheets

U.S. PATENT DOCUMENTS

| | | | |
|---|---|---|---|
| 5,474,957 A | 12/1995 | Urushima | 437/209 |
| 5,474,958 A | 12/1995 | Djennas et al. | 437/211 |
| 5,508,938 A | 4/1996 | Wheeler | |
| 5,530,288 A | 6/1996 | Stone | 257/700 |
| 5,531,020 A | 7/1996 | Durand et al. | 29/840 |
| 5,574,309 A | 11/1996 | Papapietro et al. | 257/679 |
| 5,581,498 A | 12/1996 | Ludwig et al. | 365/63 |
| 5,582,858 A | 12/1996 | Adamopoulos et al. | 427/96 |
| 5,616,422 A | 4/1997 | Ballard et al. | 428/621 |
| 5,637,832 A | 6/1997 | Danner | 174/260 |
| 5,674,785 A | 10/1997 | Akram et al. | 437/217 |
| 5,719,749 A | 2/1998 | Stopperan | 361/769 |
| 5,739,579 A * | 4/1998 | Chiang et al. | 257/635 |
| 5,739,581 A | 4/1998 | Chillara | 257/668 |
| 5,739,585 A | 4/1998 | Akram et al. | 257/698 |
| 5,739,588 A | 4/1998 | Ishida et al. | 257/782 |
| 5,742,479 A | 4/1998 | Asakura | 361/737 |
| 5,774,340 A | 6/1998 | Chang et al. | |
| 5,784,259 A | 7/1998 | Asakura | 361/752 |
| 5,798,014 A | 8/1998 | Weber | 156/263 |
| 5,822,190 A | 10/1998 | Iwasaki | 361/737 |
| 5,826,330 A | 10/1998 | Isoda et al. | 29/852 |
| 5,835,355 A | 11/1998 | Dordi | 361/760 |
| 5,847,453 A | 12/1998 | Uematsu et al. | |
| 5,894,108 A | 4/1999 | Mostafazadeh et al. | 174/52.4 |
| 5,903,052 A | 5/1999 | Chen et al. | 257/706 |
| 5,936,843 A | 8/1999 | Ohshima et al. | 361/760 |
| 5,952,611 A | 9/1999 | Eng et al. | 174/52.4 |
| 6,004,619 A | 12/1999 | Dippon et al. | 427/97 |
| 6,013,948 A | 1/2000 | Akram et al. | 257/698 |
| 6,021,564 A | 2/2000 | Hanson | 29/852 |
| 6,028,364 A | 2/2000 | Ogino et al. | 257/778 |
| 6,034,427 A | 3/2000 | Lan et al. | 257/698 |
| 6,040,622 A | 3/2000 | Wallace | 257/679 |
| 6,060,778 A | 5/2000 | Jeong et al. | 257/710 |
| 6,069,407 A | 5/2000 | Hamzehdoost | 257/774 |
| 6,072,243 A | 6/2000 | Nakanishi | 257/783 |
| 6,081,036 A | 6/2000 | Hirano et al. | |
| 6,119,338 A | 9/2000 | Wang et al. | 29/852 |
| 6,122,171 A | 9/2000 | Akram et al. | 361/704 |
| 6,127,250 A | 10/2000 | Sylvester et al. | 438/584 |
| 6,127,833 A | 10/2000 | Wu et al. | 324/755 |
| 6,160,705 A | 12/2000 | Stearns et al. | 361/704 |
| 6,172,419 B1 | 1/2001 | Kinsman | 257/737 |
| 6,175,087 B1 | 1/2001 | Keesler et al. | |
| 6,184,463 B1 | 2/2001 | Panchou et al. | 174/52.4 |
| 6,204,453 B1 | 3/2001 | Fallon et al. | |
| 6,214,641 B1 | 4/2001 | Akram | 438/107 |
| 6,235,554 B1 | 5/2001 | Akram et al. | 438/109 |
| 6,239,485 B1 | 5/2001 | Peters et al. | |
| D445,096 S | 7/2001 | Wallace | D14/117 |
| D446,525 S | 8/2001 | Okamoto et al. | D14/436 |
| 6,274,821 B1 | 8/2001 | Echigo et al. | 174/255 |
| 6,280,641 B1 | 8/2001 | Gaku et al. | 216/17 |
| 6,316,285 B1 | 11/2001 | Jiang et al. | 438/106 |
| 6,351,031 B1 | 2/2002 | Iijima et al. | |
| 6,353,999 B1 | 3/2002 | Cheng | 29/852 |
| 6,365,975 B1 | 4/2002 | DiStefona et al. | |
| 6,376,906 B1 | 4/2002 | Asai et al. | |
| 6,392,160 B1 | 5/2002 | Andry et al. | 174/261 |
| 6,395,578 B1 | 5/2002 | Shin et al. | 438/106 |
| 6,405,431 B1 | 6/2002 | Shin et al. | 29/852 |
| 6,406,942 B1 | 6/2002 | Honda | 438/119 |
| 6,407,341 B1 | 6/2002 | Anstrom et al. | 174/255 |
| 6,407,930 B1 | 6/2002 | Hsu | 361/784 |
| 6,451,509 B1 | 9/2002 | Keesler et al. | 430/311 |
| 6,479,762 B1 | 11/2002 | Kusaka | 174/261 |
| 6,497,943 B1 | 12/2002 | Jimarez et al. | 428/209 |
| 6,517,995 B1 | 2/2003 | Jacobson et al. | 430/320 |
| 6,534,391 B1 | 3/2003 | Huemoeller et al. | 438/612 |
| 6,544,638 B1 | 4/2003 | Fischer et al. | 428/322.7 |
| 6,574,106 B1 | 6/2003 | Mori | 361/705 |
| 6,586,682 B1 | 7/2003 | Strandberg | 174/255 |
| 6,608,757 B1 | 8/2003 | Bhatt et al. | |
| 6,660,559 B1 | 12/2003 | Huemoeller et al. | 438/106 |
| 6,715,204 B1 | 4/2004 | Tsukada et al. | 29/847 |
| 6,727,645 B1 | 4/2004 | Tsujimura et al. | 313/504 |
| 6,730,857 B1 | 5/2004 | Konrad et al. | 174/257 |
| 6,753,612 B1 | 6/2004 | Adae-Amoakoh et al. | 257/774 |
| 6,787,443 B1 | 9/2004 | Boggs et al. | 438/612 |
| 6,803,528 B1 | 10/2004 | Koyanagi | 174/262 |
| 6,815,709 B1 | 11/2004 | Clothier et al. | |
| 6,815,739 B1 | 11/2004 | Huff et al. | 257/275 |
| 6,989,593 B1 | 1/2006 | Khan et al. | 257/707 |
| 2002/0017712 A1 | 2/2002 | Bessho et al. | 257/700 |
| 2003/0128096 A1 | 7/2003 | Mazzochette | 338/22 |

FOREIGN PATENT DOCUMENTS

| | | |
|---|---|---|
| JP | 05-136323 | 6/1993 |
| JP | 07-017175 | 1/1995 |
| JP | 08-190615 | 7/1996 |
| JP | 10-334205 | 12/1998 |

* cited by examiner

SEMICONDUCTOR PACKAGE AND SUBSTRATE HAVING MULTI-LEVEL VIAS

FIELD OF THE INVENTION

The present invention relates generally to semiconductor packaging, and more specifically, to a substrate having vias generated formed in sections.

BACKGROUND OF THE INVENTION

Semiconductors and other electronic and opto-electronic assemblies are fabricated in groups on a wafer. Known as "dies", the individual devices are cut from the wafer and are then bonded to a carrier. The dies must be mechanically mounted and electrically connected to a circuit.

Semiconductor dies are typically packaged in a semiconductor package that includes terminals for electrically and often mechanically connecting the semiconductor package to an external device, such as a printed circuit board. A substrate typically provides connections from electrical connections of the semiconductor die (via wire-bonding to pads or ball-attach) to the terminals by providing a circuit pattern in or on the surfaces of one or more dielectric layers. When multiple layers are incorporated in the substrate, vias provide connections between layers.

As semiconductor die circuit complexity has increased, the number of electrical connections has generally increased, causing a need for increasingly dense terminal arrays. The substrate circuit density generally limits the terminal density, as the line width, inter-line spacing and via size of the substrate circuit pattern dictate the density of the terminal pattern. With techniques such as laminated circuit patterns, and dielectric-embedded circuit patterns, substrate conductor density can be increased dramatically. However, the minimum via diameter still provides a limitation on either the number of terminals (due to deletion of terminals in via areas) or the terminal spacing (due to the presence of vias between terminals). The minimum via diameter is dictated by several factors, including registration between layer circuit patterns, plating or etching tolerances and photo-mask tolerance and alignment limitations.

In particular, a via will not plate properly when the circuit pattern is large compared to the via. Because the height of the via requires substantial upward plating, the via must be of sufficient diameter to permit the growth of the via, while providing an efficient plating process for the balance of the circuit pattern. Further, when a via is formed through the substrate dielectric material, the material is laser-ablated or otherwise drilled through to provide the via hole. The depth of the via hole dictates the process time required to laser-ablate the hole.

Therefore, it would be desirable to provide substrates having reduced via diameter in light of the above-listed limitations and while providing a desirable plating aspect ratio. It would further be desirable to provide a method of manufacturing the substrates having decreased via diameter with low incremental cost. It would also be desirable to reduce the time required to generate via holes in a dielectric material.

SUMMARY OF THE INVENTION

The above objectives of reducing via diameter in a semiconductor package substrate while maintaining plating aspect ratios and decreasing via hole formation time are provided in a substrate and method for manufacturing a substrate.

The substrate and resulting semiconductor substrate include vias that are formed in two parts: a first tier section that is plated to a metal circuit pattern, and a second half-via that is added atop the tier section through a hole produced in a dielectric that is deposited over the substrate. The method includes the steps of plating the first tier section onto the circuit pattern, adding dielectric over the substrate, ablating the substrate to produce a void through to the tier and then adding metal in the void to produce a via from the conductive pattern to the surface of the dielectric. The tier and the half-via have differing diameter to provide registration tolerance, but the half-via may be of larger or smaller diameter than the tier. A tin plating may be used above the circuit material and/or above the tier to provide plating control in accordance with an alternative method for providing the multi-level vias.

BRIEF DESCRIPTION OF THE DRAWINGS

The invention, as well as a preferred mode of use and advantages thereof, will best be understood by reference to the following detailed description of illustrative embodiments when read in conjunction with the accompanying drawings, wherein like reference numerals indicate like parts throughout.

DETAILED DESCRIPTION

Referring now to the figures and in particular to FIGS. 1A–1H, a cross-sectional view of stages of preparation of a substrate in accordance with an embodiment of the present invention is shown.

Figure 1A:
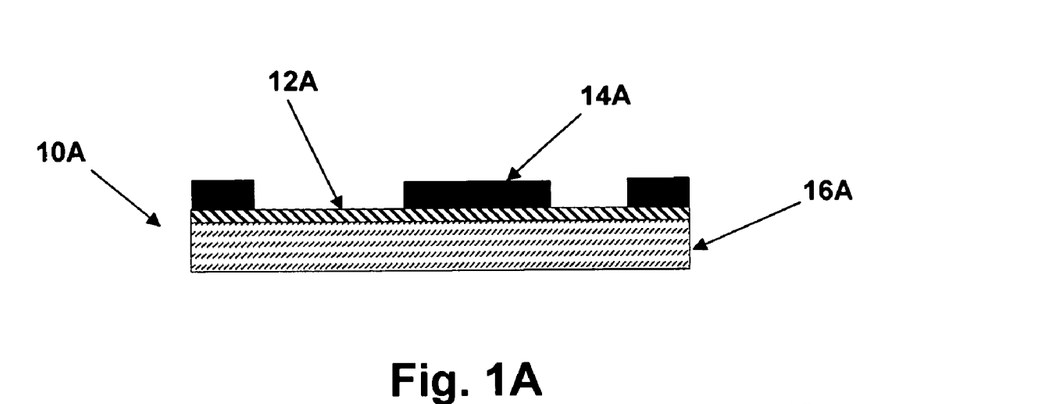
FIGS. 1A–1H are pictorial diagrams depicting a cross-sectional view of stages of preparation of a substrate in accordance with an embodiment of the present invention.

FIG. 1A shows a first stage 10A in preparation of a substrate. A metal covered dielectric 16A may be formed by depositing or laminating a metal, generally copper, and planarizing/reducing the metal to yield a very thin metal layer 12A that will be plated over and then un-plated areas will be etched away in subsequent process steps. A resist mask 14A is applied over metal layer 12A, generally by a dry-film photo-masking process. The mask is a negative image of circuit patterns to be generated on substrate 10A in a plate-up process.

Figure 1B:
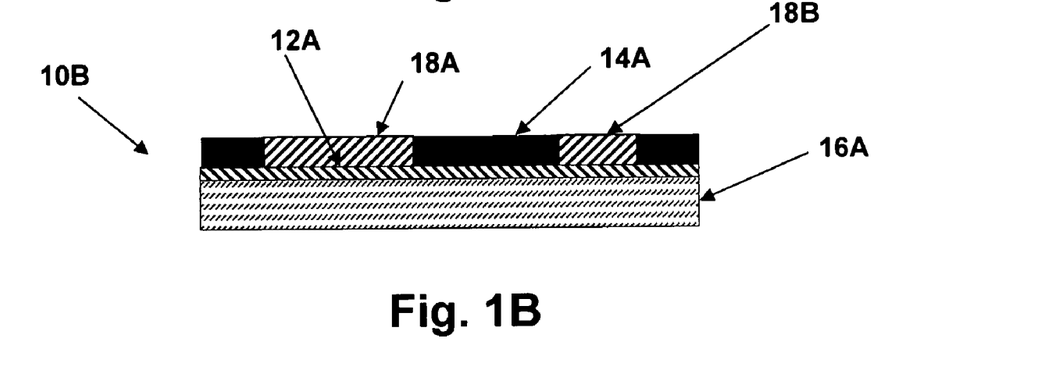
Figure 1C:
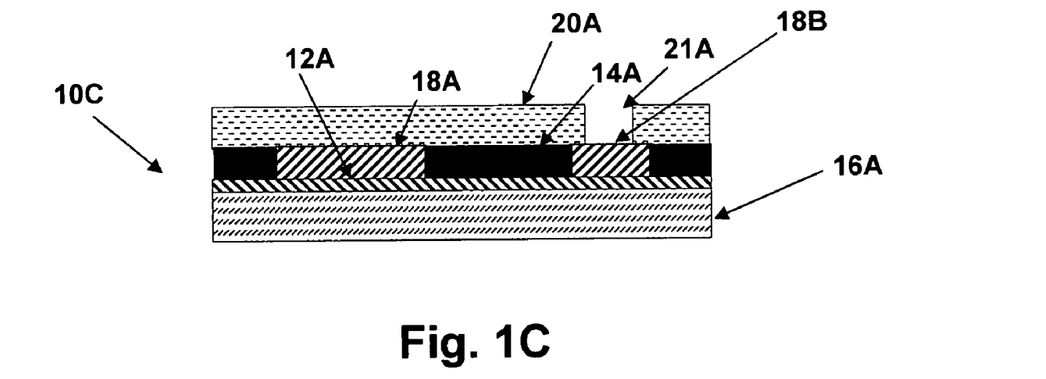

FIG. 1B shows a next state of preparation of substrate stage 10B. Metal, also generally copper, is plated over the exposed regions between plating resist 14A patterns to form circuit patterns 18A and 18B. Next, as shown in FIG. 1C, a second resist mask 20A is applied to form substrate stage 10C. Holes 21A in resist mask provide support for plating up portions of vias in accordance with embodiments of the present invention.

Figure 1D:
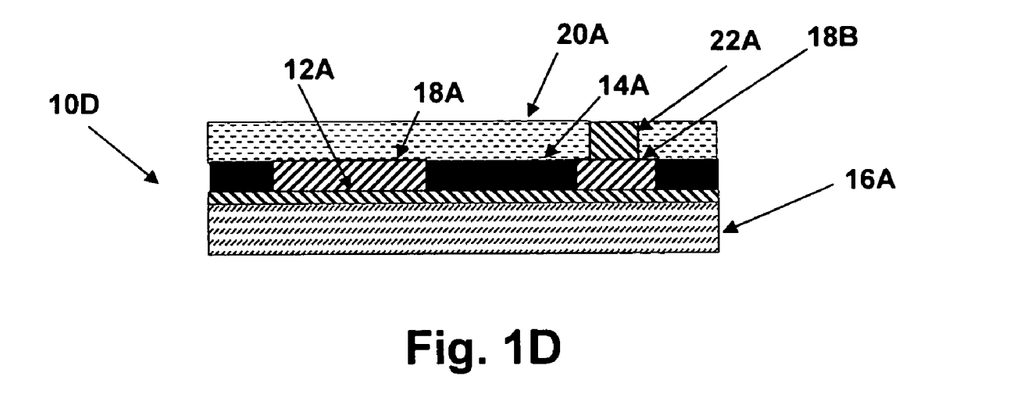

In FIG. 1D, a next stage 10D of substrate preparation is illustrated. Metal, again generally copper, is plated into holes 21A to form a portion of a via 22A, referred to as a "tier" or stub. Generally, the portion has the height of half of the final via, but the height may be varied depending on plating requirements generally dictated by the size of the via vs. the size of the conductive circuit patterns.

Figure 1E:
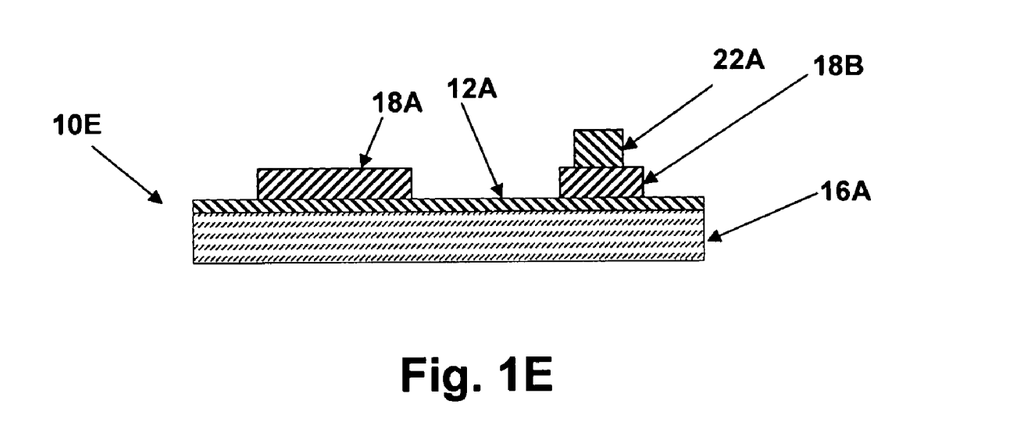
Figure 1F:
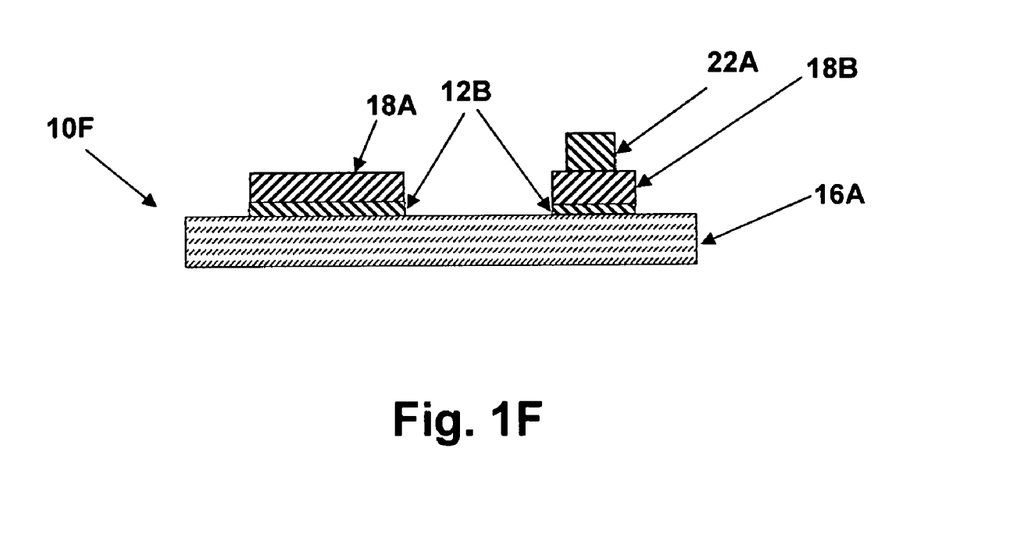

Once tier 22A has been fabricated on circuit pattern 18B, the resist layers (20A, 14A) are stripped and the completely metalized dielectric layer 16A is exposed in substrate stage 10E of FIG. 1E. Substrate stage 10E is etched to remove the metal 12A bridging circuit patterns 18A, 18B that was present to support the plating operations. The resulting substrate stage 10F of FIG. 1F includes circuit patterns formed from original metal layer 12B and plated up circuit pattern areas 18A and 18B, along with via tiers such as via tier 22A.

Figure 1G:
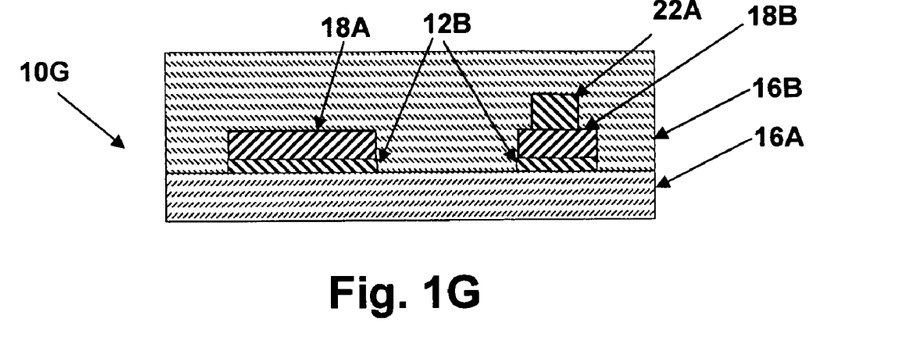
Figure 1H:
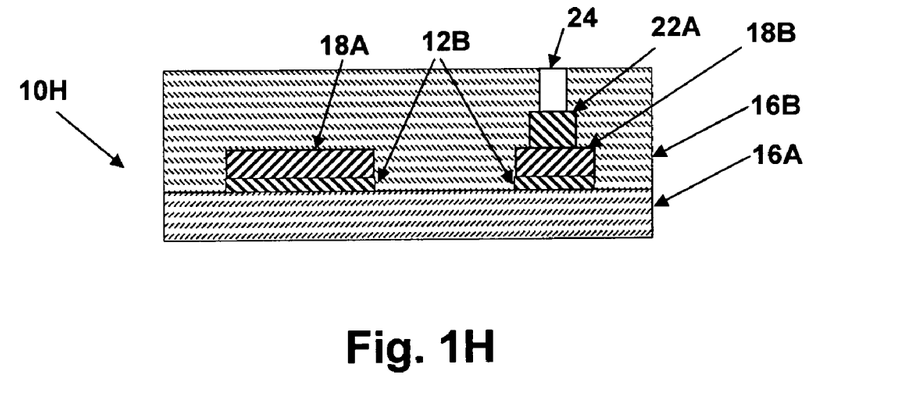

Next, circuit patterns 18A and 18B along with via tier 22A are covered by a second dielectric layer 16B that encloses the circuit patterns forming substrate stage 10G, as shown in FIG. 1G. Holes 24 are laser-ablated or formed by machining or other means through dielectric layer 16B above via tiers 22A to form substrate stage 10H as shown in FIG. 1H.

Figure 2:
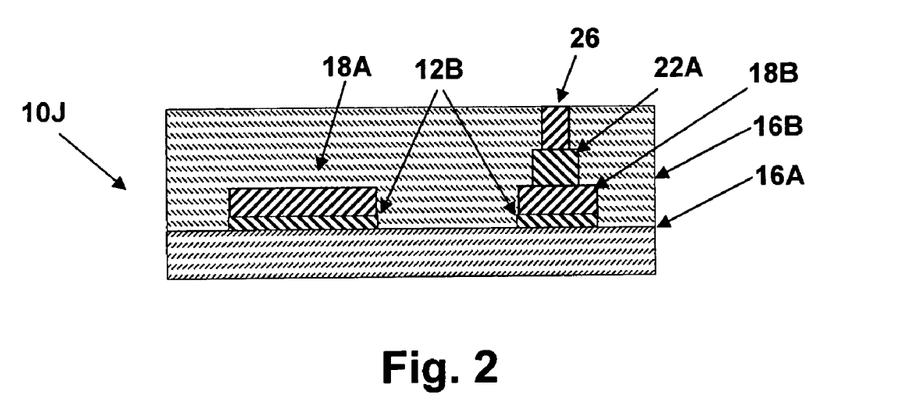
FIG. 2 is a pictorial diagram depicting a cross-section of a substrate in accordance with an embodiment of the present invention.

Finally, as shown in FIG. 2, metal is applied in holes 24 to complete the vias by either plating or application of conductive paste. The metal forms a half via portion 26 that completes an electrical path from circuit pattern 18B to the top of second dielectric layer 16B. The above-described process permits plating of much smaller vias than is possible with a plating process that plates the entire height of a via. Structural differences are present in the vias of the present invention, as the diameter of tier 22A differs from that of half-via 26, so that one or the other can be registered within the periphery of the other.

Figure 3A:
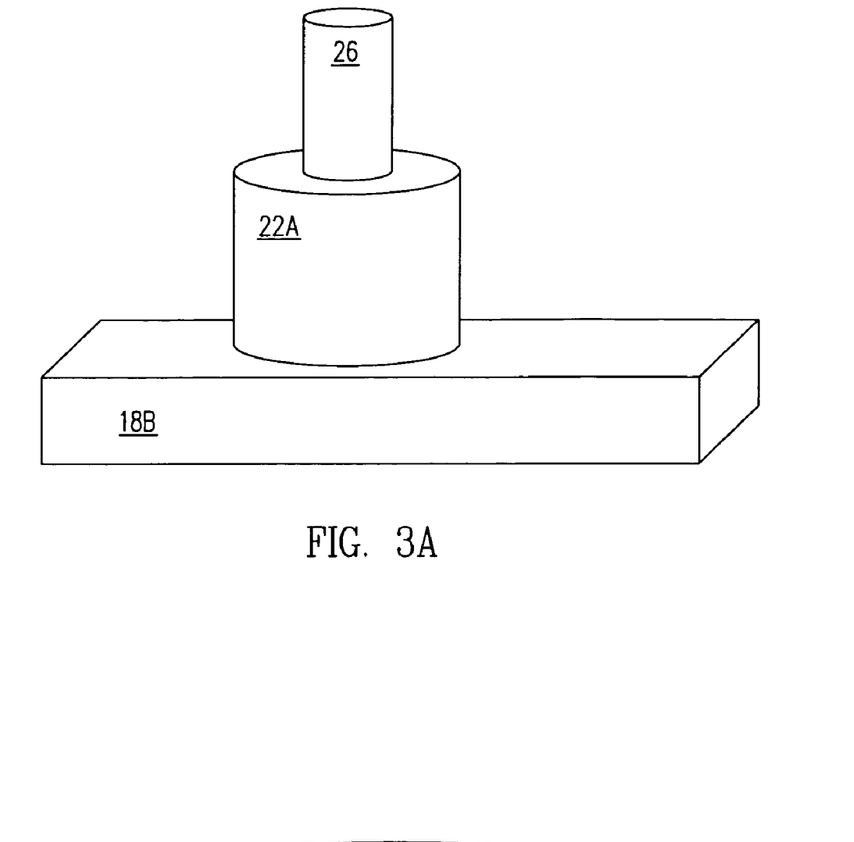
FIGS. 3A and 3B are pictorial diagrams depicting a perspective view of a via metal structure as present in embodiments of the present invention.
Figure 3B:
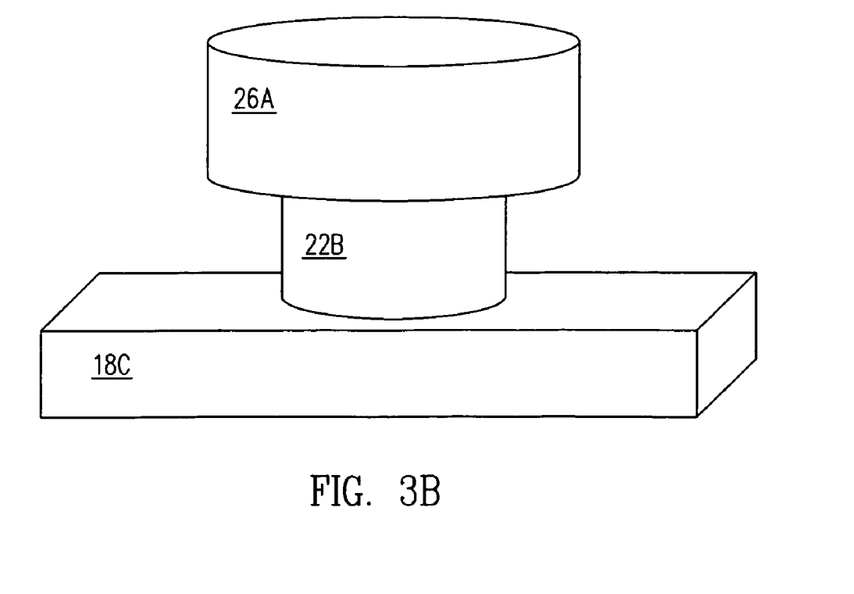

Referring now to FIG. 3A, half-via portion 26 atop tier 22A having a larger diameter is illustrated. Only the metallic portion of the via is shown along with circuit pattern 18B to which the via has been added. FIG. 3B shows a reversal in relative diameters with a larger diameter half-via portion 26A added atop a smaller diameter tier 22B that has been plated on a circuit pattern 18C. FIGS. 3A and 3B are provided to illustrate in detail the via structures (inter-dielectric) of the present invention as produced by the above-described process. An encapsulation may be added over semiconductor die 36A and substrate 30A to provide a complete semiconductor package that is sealed against environmental conditions.

Figure 4A:
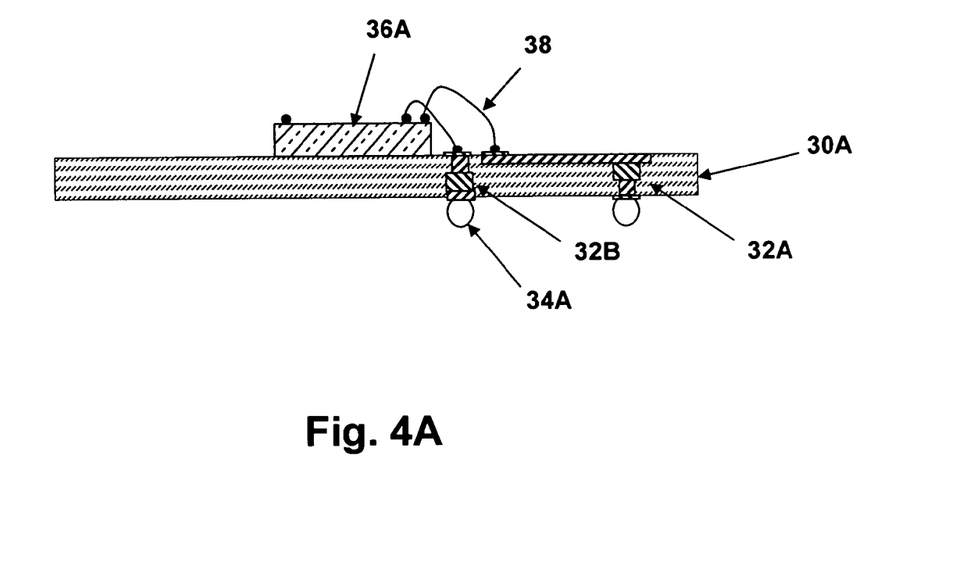
FIGS. 4A and 4B are pictorial diagrams depicting semiconductor packages circuits in accordance with embodiments of the present invention.

Referring now to FIG. 4A, a semiconductor package in accordance with an embodiment of the present invention is shown.

Substrate 30A is a substrate prepared according to the above-described process and having vias 32A and 32B formed in accordance with the above-described structures, one via 32A having a larger diameter tier near the top of substrate 30A as depicted and one via 32B having a smaller diameter tier near the top of substrate 30A as depicted. A semiconductor die 36A is attached to substrate 30A by an adhesive (not shown) and electrically connected by wires 38 to the circuit patterns of substrate 30A. Solder ball 34A terminals for forming a ball grid array (BGA) attach pattern are attached to plated areas formed on vias 32A and 32B. An encapsulation may be added over semiconductor die 36A and substrate 30A to provide a complete semiconductor package that is sealed against environmental conditions.

Figure 4B:
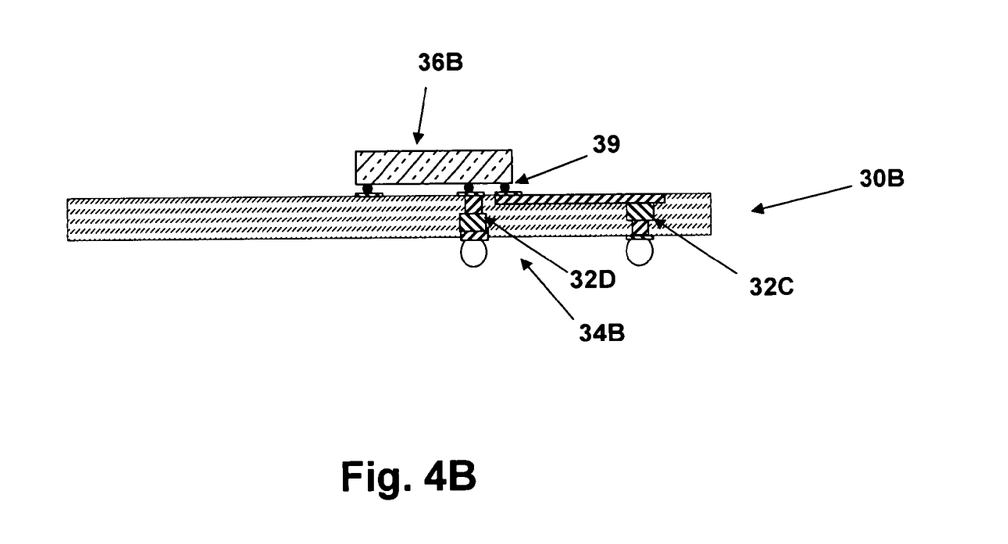

Referring now to FIG. 4B, a semiconductor package in accordance with another embodiment of the present invention is shown. Substrate 30B is a substrate prepared according to the above-described process and having vias 32C and 32D formed in accordance with the above-described structures, one via 32C having a larger diameter tier near the top of substrate 30B as depicted and one via 32D having a smaller diameter tier near the top of substrate 30B as depicted. A semiconductor die 36B in the form of a flip-chip die is mechanically and electrically connected to substrate 30B by solder balls 39 attached to the circuit patterns of substrate 30B. Solder ball 34B terminals for forming a ball grid array (BGA) attach pattern are attached to plated areas formed on vias 32C and 32D. An encapsulation may be added over semiconductor die 36B and substrate 30B to provide a complete semiconductor package that is sealed against environmental conditions.

Referring now to FIGS. 5A–5H, a cross-sectional view of stages of preparation of a substrate in accordance with another embodiment of the present invention is shown.

Figure 5A:
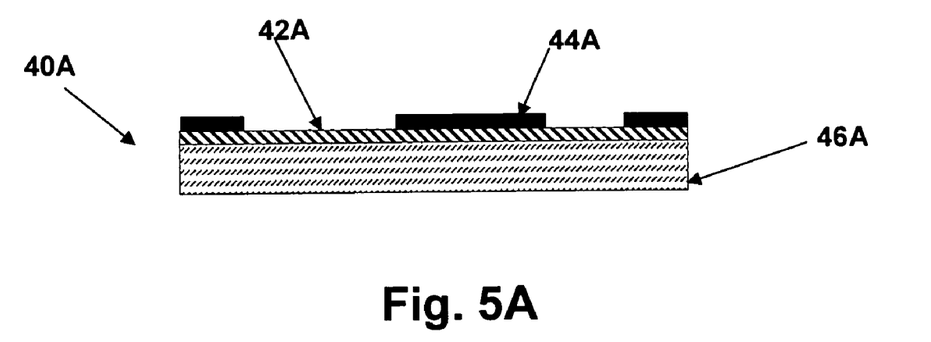
FIGS. 5A–5H are pictorial diagrams depicting a cross-sectional view of stages of preparation of a substrate in accordance with another embodiment of the present invention.

FIG. 5A shows a first stage 40A in preparation of the substrate. A metal covered dielectric 46A may be formed by depositing or laminating a metal, generally copper, and planarizing/reducing the metal to yield a very thin metal layer 42A that will be plated over and then un-plated areas will be etched away in subsequent process steps. A resist mask 44A is applied over metal layer 42A, generally by a dry-film photo-masking process. The mask is a negative image of circuit patterns to be generated on substrate 40A in a plate-up process.

Figure 5B:
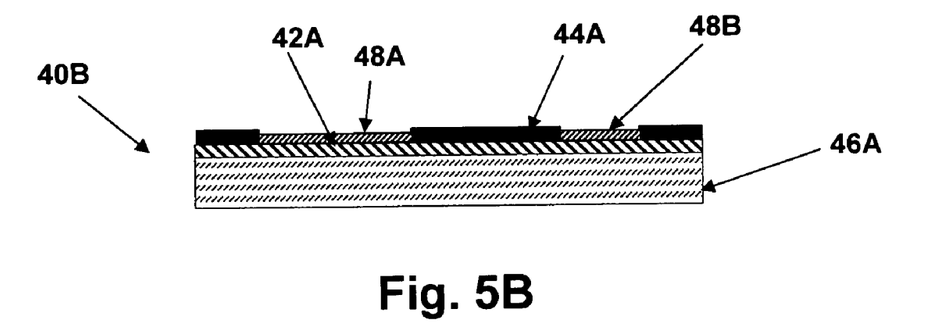
Figure 5C:
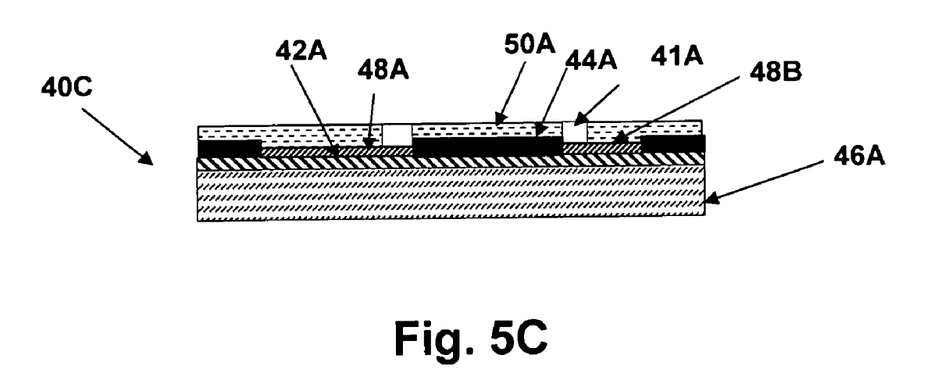

FIG. 5B shows a next state of preparation of substrate stage 40B. A metal unaffected by the etchant, generally tin, is plated over the exposed regions between plating resist 44A patterns to form circuit patterns 48A and 48B. Next, as shown in FIG. 5C, a second resist mask 50A is applied to form substrate stage 40C. Holes 41A in resist mask provide support for plating up portions of vias in accordance with embodiments of the present invention.

Figure 5D:
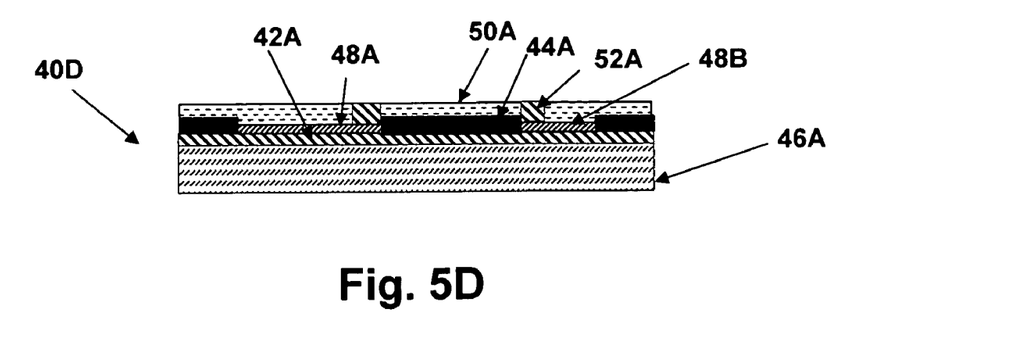
Figure 5E:
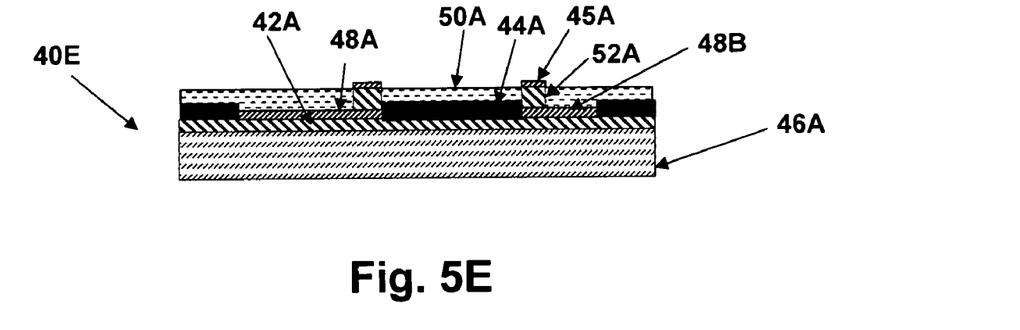

In FIG. 5D, a next stage 40D of substrate preparation is illustrated. Metal, generally copper, is plated into holes 41A to form a tier portion 52A of via. Then, tin (or other metal unaffected by the etchant) is plated to form a plating layer 45A over tier 52A to form substrate stage 40E of FIG. 5E.

Figure 5F:
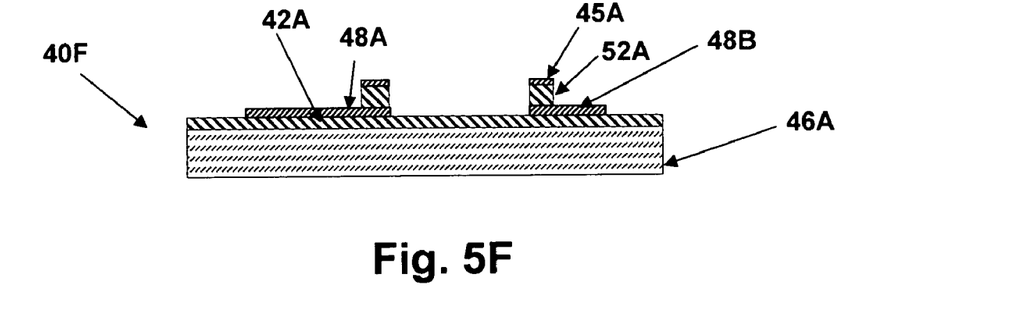

Once tier 52A with plating layer 45A has been fabricated on circuit pattern 48B, the resist layers (50A, 44A) are stripped and the completely metalized dielectric layer 46A is exposed in substrate stage 40F of FIG. 5F. Substrate stage 40F is etched to remove the portions of metal layer 42A that were bridging circuit patterns 48A, 48B and was present to support the plating operations. The resulting substrate stage 40G of FIG. 5G includes circuit patterns formed from original metal layer portions 42B and plated up circuit pattern areas 48A and 48B (of differing metal type), along with via tiers such as via tier 52A.

Figure 5G:
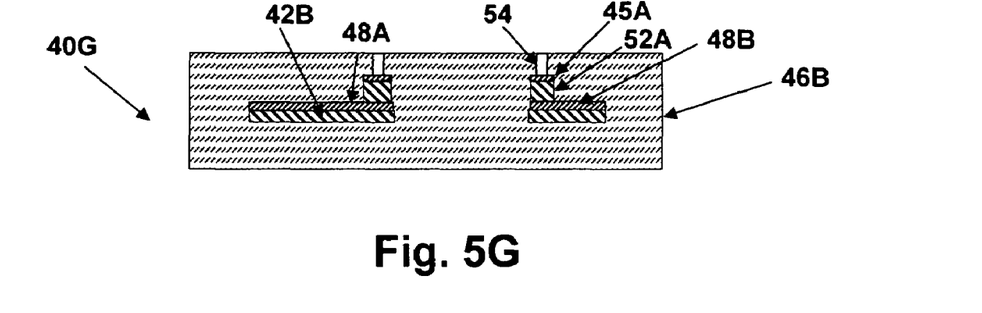

Next, circuit patterns 48A and 48B along with via tier 52A are covered by a second dielectric layer forming an enclosed dielectric 46B that encloses the circuit patterns. Holes 54 are laser-ablated or formed by machining or other means through dielectric layer 46B above via tiers 52A to form substrate stage 40G.

Figure 5H:
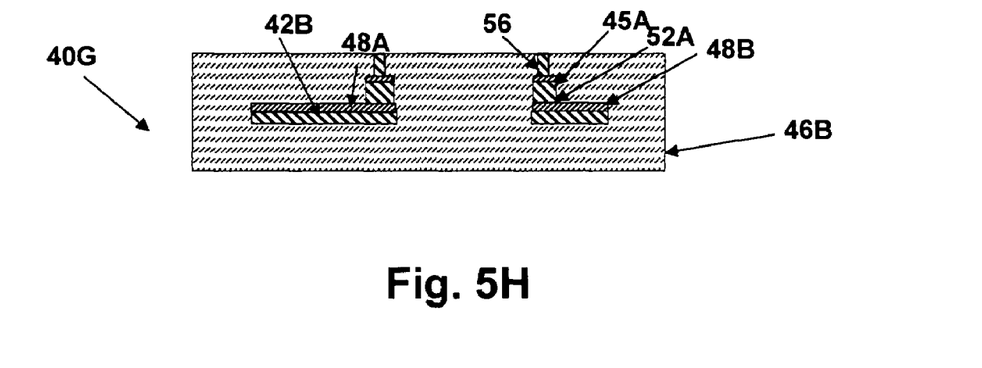

Finally, metal is applied in holes 54 to complete the vias by either plating or application of conductive paste. The metal forms a half via portion 56 that completes an electrical path from circuit pattern 48B to the top of second dielectric layer 46B. The above-described process permits plating of much smaller vias than is possible with a plating process that plates the entire height of a via as described above for the other embodiments of the invention. Structural differences are present in the vias of the present embodiment, as a plating layer 45A of metal not susceptible to the etchant (e.g., tin) is present between the top half-via portion 56 and tier 52A and circuit pattern 48B is formed from a non-susceptible metal atop a like-shaped portion of the original metal layer portions 42B.

Figure 6:
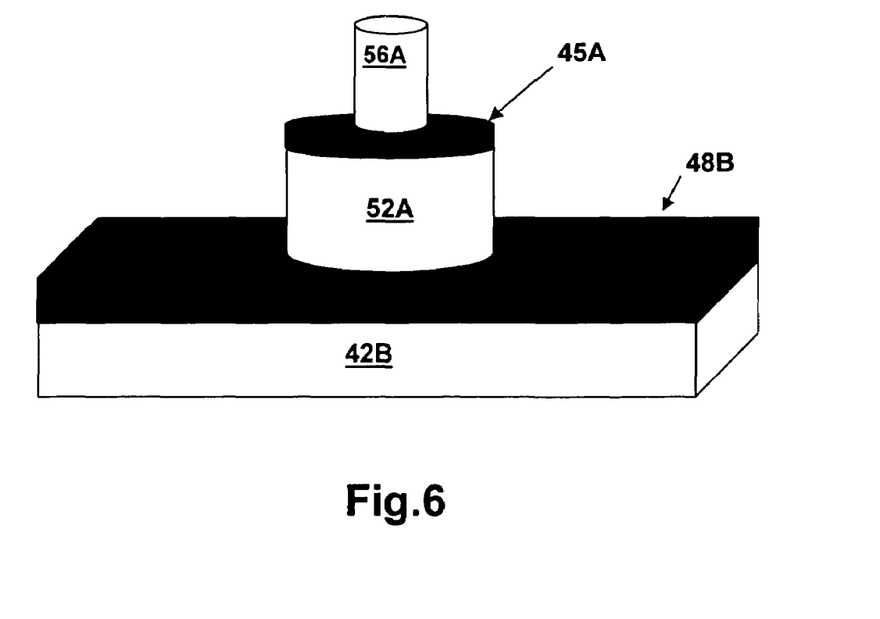
FIG. 6 is a pictorial diagram depicting a via metal structure as present in another embodiment of the present invention.

FIG. 6 depicts the structure of the via showing only the metal portions of the via and circuit patterns. Half-via portion 56A is shown atop plating layer 45A deposited on tier 52A. The relative diameter of tier to plating layer 45A and tier 52A can be reversed, as for the embodiment depicted in FIG. 3B. FIG. 6 also shows plating layer forming circuit pattern 48B atop the portion of original circuit material 42A on which tier 52A was plated.

The above description of embodiments of the invention is intended to be illustrative and not limiting. Other embodiments of this invention will be obvious to those skilled in the art in view of the above disclosure and fall within the scope of the present invention.

What is claimed is:

1. A substrate for mounting at least one die within a semiconductor package, comprising:
    a first dielectric layer having a metal circuit pattern formed on a first face thereof;
    a second dielectric layer having a first face bonded to the first face of the first dielectric layer, whereby the metal circuit pattern is covered; and
    blind vias extending within the second dielectric layer from and perpendicular to a second face of the second dielectric layer inward to the circuit pattern, wherein the blind vias including a tier portion extending partially through the second dielectric layer from the circuit pattern to an interface with a partial via portion extending from the interface to the second face of the second dielectric layer, and wherein the partial via portion has a diameter differing from that of the tier portion, whereby registration of the interface is facilitated.

2. The substrate of claim 1, wherein the tier portion is formed from copper plated atop the circuit pattern.

3. The substrate of claim 2, wherein the partial via portion is formed from copper plated atop the tier portion.

4. The substrate of claim 2, wherein the partial via portion is formed from a conductive paste added atop the tier portion.

5. The substrate of claim 1, wherein the partial via portion extends through a laser-ablated void formed in the second dielectric layer.

6. The substrate of claim 1, further comprising a first metal plating layer of dissimilar metal from the circuit pattern between the circuit pattern and the tier portion.

7. The substrate of claim 6, further comprising a second metal plating layer of the dissimilar metal from the circuit pattern between the partial via portion and the tier portion.

8. The substrate of claim 7, wherein the circuit pattern and the tier portion are plated copper and wherein the first metal plating layer and the second metal plating layer are tin.

9. The substrate of claim 1, further comprising a metal plating layer of dissimilar metal from the circuit pattern between the partial via portion and the tier portion.

10. A semiconductor package, comprising:
    a substrate having a circuit pattern embedded therein with vias extending from the circuit pattern to a face of the substrate, wherein the vias include a tier portion extending from the circuit pattern to an interface with a half via portion extending from the interface to the face of the substrate, and wherein the diameter of the half via portion differs from the diameter of the tier portion;
    a die mounted to the substrate; and
    a plurality of electrical terminals mounted to the substrate for connecting the die to external circuits.

11. The semiconductor package of claim 10, wherein the tier portion is formed from copper plated atop the circuit pattern.

12. The semiconductor package of claim 11, wherein the partial via portion is formed from copper plated atop the tier portion.

13. The semiconductor package of claim 11, wherein the partial via portion is formed from a conductive paste added atop the tier portion.

14. The semiconductor package of claim 10, further comprising a first metal plating layer of dissimilar metal from the circuit pattern between the circuit pattern and the tier portion.

15. The semiconductor package of claim 14, further comprising a second metal plating layer of the dissimilar metal from the circuit pattern between the partial via portion and the tier portion.

16. A substrate for mounting at least one die within a semiconductor package, comprising:
    a first dielectric layer having a metal circuit pattern formed on a first face thereof;
    a second dielectric layer having a first face bonded to the first face of the first dielectric layer, whereby the metal circuit pattern is covered; and
    blind vias extending within the second dielectric layer from and perpendicular to a second face of the second dielectric layer inward to the circuit pattern, wherein the blind vias include means for reducing a plating height from the circuit pattern required to plate the via above the circuit pattern and means for completing the via from an end of the means for reducing to the second face of the second dielectric layer.

17. The substrate of claim 16, further comprising means for preventing removal of the circuit pattern during an etching process, wherein the means for preventing removal is located between the circuit pattern and the means for reducing.

18. The substrate of claim 16, further comprising means for preventing removal of the means for reducing during an etching process, wherein the means for preventing removal is located between the means for reducing and the means for completing the via.

19. A substrate for mounting at least one die within a semiconductor package, comprising:
    at least one dielectric layer;
    a metal circuit pattern within said at least one dielectric layer whereby said at least one dielectric layer encloses said metal circuit pattern; and
    a blind via extending within the at least one dielectric layer from the circuit pattern to an external surface of the at least one dielectric layer, wherein said blind via comprises a first metal segment having a first cross-sectional width and a second metal segment having a second cross-sectional width substantially differing from said first cross-sectional width.

20. The substrate of claim 19, wherein said blind via further comprises a third metal segment of material differing from that of said first metal segment and said second metal segment disposed between and electrically connecting said first metal segment and said second metal segment.

* * * * *